United States Patent

Johnson

[15] 3,704,394

[45] Nov. 28, 1972

[54] RECEPTACLE FOR PRINTED CIRCUIT STRUCTURES WITH BUS BAR MOUNTING MEANS

[72] Inventor: Lennart B. Johnson, Topsfield, Mass.

[73] Assignee: Teradyne, Inc., Boston, Mass.

[22] Filed: July 6, 1971

[21] Appl. No.: 159,786

[52] U.S. Cl. ...........317/101 DH, 317/118, 339/17 M

[51] Int. Cl. ..............................................H05k 7/18

[58] Field of Search ......317/101 DH, 118; 339/17 R, 339/17 L, 17 LC, 17 LM, 17 M, 22

[56] References Cited

UNITED STATES PATENTS

| | | | |
|---|---|---|---|
| 3,231,785 | 1/1966 | Calabro | 339/17 LM |
| 3,360,689 | 12/1967 | Haury | 317/101 DH |
| 3,550,062 | 12/1970 | Drenten | 317/101 DH |
| 3,202,955 | 8/1965 | McKee | 317/101 DH |
| 3,476,982 | 11/1969 | Bell | 339/17 M |

FOREIGN PATENTS OR APPLICATIONS

| | | | |
|---|---|---|---|
| 1,134,126 | 8/1962 | Germany | 317/101 DH |

*Primary Examiner*—Robert K. Schaefer
*Assistant Examiner*—Gerald P. Tolin
*Attorney*—Herbert W. Kenway et al.

[57] ABSTRACT

A connection and mounting receptacle for printed circuit cards has pairs of slotted stiffly resilient card guides, each of which has a pair of opposing nodes protruding into the slot from slot-forming side walls which are not connected in the region of the nodes to provide a spring grip on an inserted card, and has two tie beams interconnecting the free ends of the card guides. A connector which seatingly receives the contact-bearing edge of the circuit card carries the paired card guides.

8 Claims, 8 Drawing Figures

INVENTOR
LENNART B. JOHNSON
BY
Kenway, Jenney & Hildreth
ATTORNEYS

INVENTOR
LENNART B. JOHNSON
BY
Kenway, Jenney & Hildreth
ATTORNEYS

RECEPTACLE FOR PRINTED CIRCUIT STRUCTURES WITH BUS BAR MOUNTING MEANS

BACKGROUND OF THE INVENTION

This invention relates to mounting and support structure for an electrical printed circuit board or card plugged into a connector. More particularly, the invention relates to such mounting and support structure for use in a stress-producing environment and which includes means for supporting the portion of the card removed from the connector to retain the card in place and to avoid strain on the electrical contacts of the card and of the connector.

The invention also provides a cage-like receptacle for plural printed circuit cards in which the connectors that seatingly receive the contact-bearing edges of the circuit cards mount interconnected card guides to form the entire receptacle on the connectors. This arrangement facilitates assembly of the receptacle, ensures alignment of card guides with the associated connector, and maintains adequate spacing between adjacent circuit cards.

A printed circuit (PC) card typically has electrical contact terminals adjacent one edge, and a connector for it has an elongated body with a recessed channel for receiving this edge. Electrical contacts disposed along the connector channel contact the PC card terminals. The connector channel and electrical contacts often do not provide sufficient support for the free portion of the PC card, which is frequently laden with relatively heavy electrical components, even under static conditions. Moreover, when environmental stress conditions of shock, vibration, centrifuge or acceleration are present, the PC card will respond, especially by vibrating. This movement can produce intolerable strain on the connector contacts, as well as on the circuit components on the card. Unless suitable support for the free end is provided, malfunction is likely.

Accordingly, a card guide is provided adjacent each end of the connector body to engage a side edge of the PC card and thereby guide the contact edge into the connector channel. In use the PC card is inserted between these guides, which then support the free end of the PC card. To provide adequate support, the card guide must hold the side edges of the PC card firmly while still allowing the PC card to slide when being inserted. PC card vibration is the most serious problem, but prior art card guides designed to suppress vibration are either too difficult to manufacture or too inefficient in operation or both. The prior art problem is compounded with large PC cards, which require long card guides which are themselves susceptible to vibration.

Further, prior receptacles for printed circuit cards often allow adjacent circuit cards to come so close together that components on the two boards interferingly engage one another. This typically results because the card guides become shelved or each card can rock within the draft, or taper, of the card guide slots sufficiently to encounter an adjacent card. Also, many prior receptacles of the present type do not uniformly provide adequate alignment of the card guiding structure with the channel of the associated connector. This defect makes it difficult to insert the circuit cards, and often unduly stresses them when they are fully installed.

SUMMARY OF THE INVENTION

The present invention provide a vibration-resistant receptacle that is both simple to manufacture and efficient in use. The invention allows the PC card to be inserted easily into the connector, while providing support adequate to suppress vibration. Further, the receptacle maintains secure spacing between the circuit cards, and consistently has uniform alignment of card guides and connectors.

More particularly, the invention provides a printed circuit receptacle in which the connectors directly carry the card guides, and in which tie beams interconnect the card guides. The connector-card guide-tie beam assemblage forms an integrated cage that allows ready insertion and removal of circuit cards, and yet maintains them securely spaced apart, even with utmost card density. Also, the receptacle mounts all the bussing conductors for the circuit board connectors, carrying them above the mounting panel for the receptacle.

Further in accordance with the invention, each card guide has two side walls and a back connecting wall which form a longitudinal slot which receives a side edge of the PC card. One or more pairs of opposing nodes or like slot constrictions are formed on the side walls and protrude into the slot to interferingly engage the side edge. The card guide is formed from a stiffly elastic material, and the back connecting wall is split in the region of the nodes, thereby transforming a portion of the side walls within which the nodes are formed into stiffly bendable beam members. Thus the invention provides a card guide having a longitudinal slot with truly resilient and non-binding gripping means therein. Such a card guide, which is easily molded, provides support adequate to suppress card vibration. The tie beam structure which interconnects the ends of card guides distal from the connectors also retards vibration of the card guides, particularly when long card guides are used. The tie beams, however, do not interfere with the easy insertion and removal of the PC cards.

BRIEF DESCRIPTION OF THE DRAWINGS

For a fuller understanding of the nature and objects of the invention, reference should be made to the following detailed description and accompanying drawings, in which.

DESCRIPTION OF THE ILLUSTRATED EMBODIMENT

Figures 1, 2, 2A:
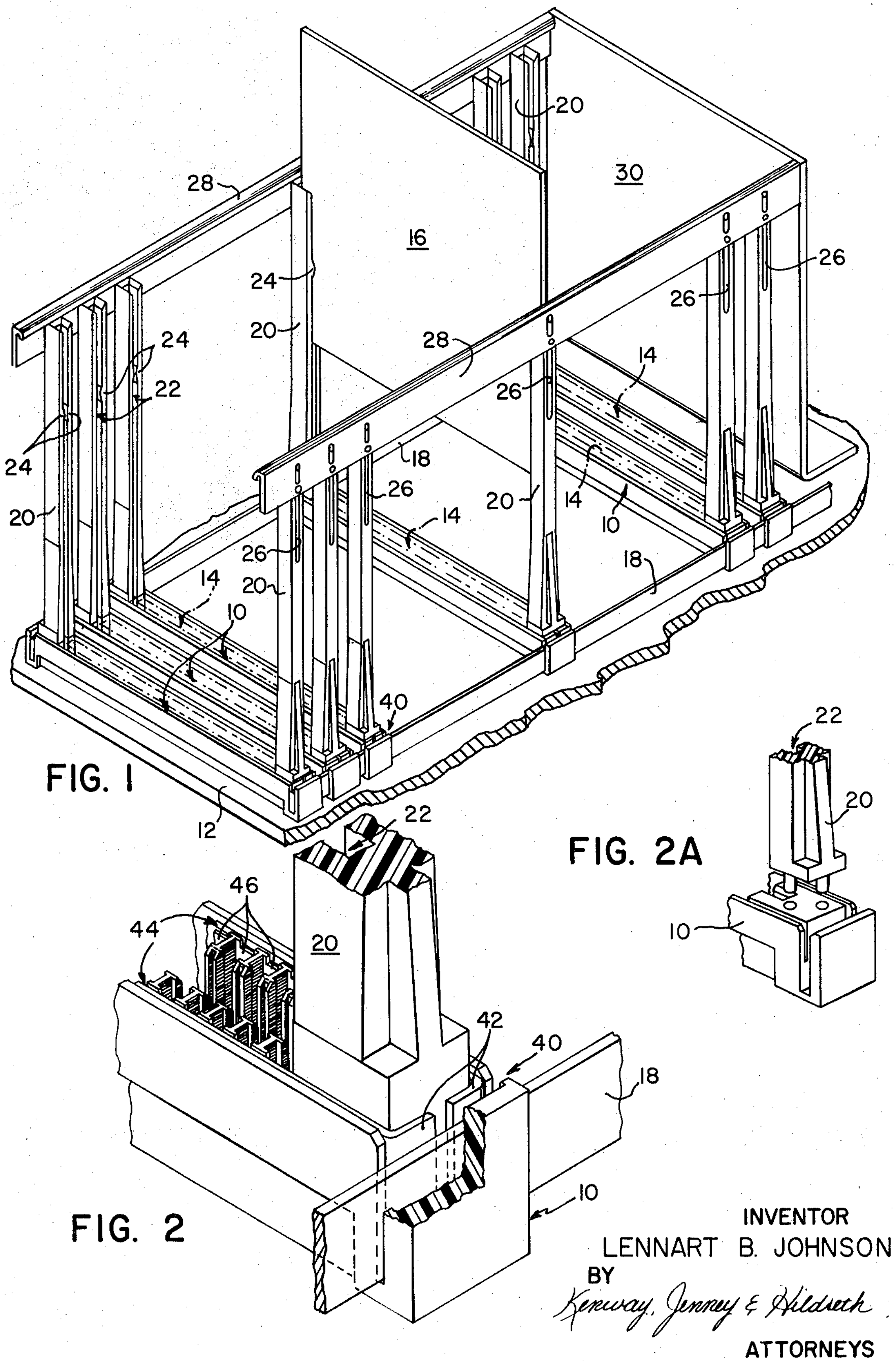
FIG. 1 is a perspective view, partly broken away, of a connector cage embodying the invention.
FIG. 2 is an enlarged fragmentary view of a connector end and common bus of FIG. 1.

Referring to FIG. 1, plural connectors 10 are mounted in a side-by-side dense array on a base plate 12. Each connector 10 is recessed with a longitudinal channel 14 for receiving and electrically contacting the contact edge of a printed circuit card 16 carrying conventional electrical terminals. For this purpose each connector 10 seats a plurality of electrical contacts (not shown) along the length of the channel 14. As is conventional, the connectors 10 provide electrical connections between these contacts and wire-wrap pins protruding from the lower side of the plate 12. Common bus bars 18 distribute one or more voltages or signals to selected contacts of the connector as is described more fully below with reference to FIG. 2.

Two card guides 20 are associated with and mounted directly on each connector 10. Inasmuch as the card guides 20 can be of one of many lengths depending on the size of the card 16, it is preferred, although not necessary to the invention, that they be replaceable and be mounted to the connectors 10 with interference-fitting peg-and-hole or like arrangements. More particularly, the insulating body of each connector 10 extends beyond each end of the socket channel therein to form a guide-mounting portion adjacent each end of the connector. The peg-and-hole or other guide-mounting structure positively locates the guide on the connector with the guide slot in a known location relative to the socket channel of the connector. In the illustrated receptacle, the slots of the two guides on each connector are coplanar with each other; further they are coplanar with the channel of that connector.

The card guides 20 can be of any stiffly elastic material. Typically they are molded of electrically insulating and elastomeric material; a glass-reinforced nylon is considered preferable. Each card guide 20 has a slot 22 extending along its length for receiving a side edge of the PC card 16. The slots 22 as illustrated communicate with the connector channel 14, but alternative embodiments depend on the configurations of the sides of the PC card 16. It is necessary only that the slots 22 guide the card 16 so that the contact edge thereon engages the connector channel 14 when the card 16 is inserted between the guides 20 of a respective connector 10. The slots 22 are formed to fit about the side edge of the card 16 as closely as possible without binding; however, due to manufacturing tolerances inherent in the fabrication of the guides 20 and of printed circuit cards, a loose fit often is unavoidable.

The card guide has nodes 24 on the side walls of the slots 22 to interferingly engage the side edge of a card 16 and thereby suppress vibrations of the card. Each slot 22 is shown with only one pair of nodes 24, but in alternative embodiments more nodes 24 can be used. Apertures 26 separate the slot-defining side walls in the region of the nodes 24 to allow the side walls to bend independently from each other. This creates a spring grip of the nodes 24 on the card 16, which in turn provides positive support. The node 24 and aperture 26 arrangement is described more fully below with reference to FIGS. 3, 4, and 5.

As mentioned above, the card guides 20 can be of any desired length relative to the height of the PC card seated therebetween. The card guides 20 can be of such length that vibration of the guides themselves presents a problem, especially if the guides 20 are of the replaceable type. In addition, the card guides tend to become skewed relative to the connectors that mount them, with the result that components on adjacent circuit boards in a dense package contact each other. To retard such vibration and prevent such skewing, tie beams 28 are provided interconnecting the free ends of the guides 20. When desired, a support bracket 30 mounted on the plate 12 can secure the tie beams to the plate. The tie beams 28, and the abutting ends of the guides 20, are constructed to avoid interference with the insertion of a card 16 into a slot 22, as is discussed herein more fully below with reference to FIGS. 6, 7 and 8.

Referring now to FIG. 2, the bus bar 18 passes through, and is mountingly seated in, a transverse end slot 40 in each connector 10 (arrayed in a row) and makes electrical contact therein with one or more voltage distribution conductors 42. The distribution conductors 42 extend along and are seated within slots 44. These slots 44 communicate with the end slot 40 and recess the connector body running parallel to the channel 14. The slots 44 and the channel 14 are separated by an insulating wall 46, and the voltage on the distribution conductors 42 is fed selectively to any contact seated along the channel 14. For this purpose the connector contacts are of two types, one which bridges the insulating wall 46 to contact the distribution conductors 42 and one which does not, to remain insulated from distribution conductors 42. It should be noted that the only conductors exposed from the sides of the connectors 10, which face the base plate 12, are the wire-wrap terminals, which extend from the connector contacts in the direction opposite to the openings of the socket channels. The bussing conductors, including the distribution conductors, are exposed and accessible from the side of the connectors facing away from the plate 12. Further the bus bars and distribution conductors are all located outside of the socket channel for ready access and to avoid interference with the printed circuit cards.

Figure 3:
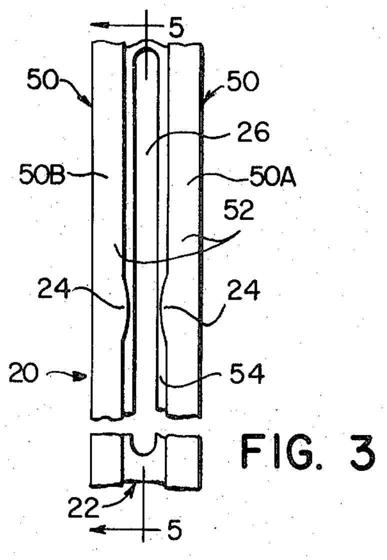
FIG. 3 is an enlarged front elevation view of the node region of a card guide of FIG. 1.
Figure 4:
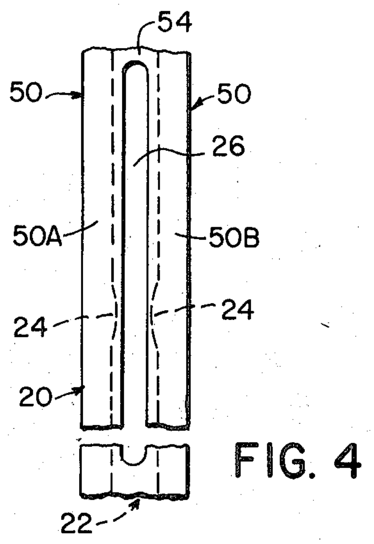
FIG. 4 is a back elevation view of the card guide region of FIG. 3.
Figure 5:
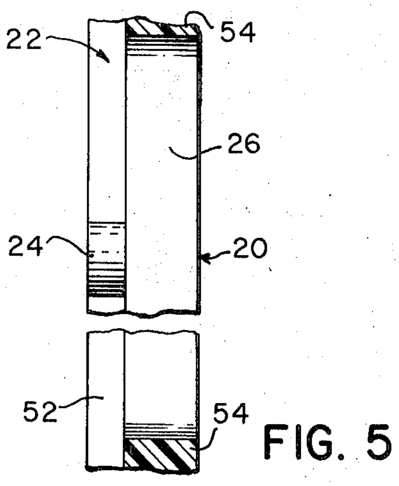
FIG. 5 is a sectional view as seen in the line 5—5 of FIG. 3.

FIGS. 3, 4 and 5 show in more detail a preferred arrangement of the card guide slot 22, the nodes 24, and the aperture 26. The illustrated slot 22 is formed by the front portions 52 of the side walls 50 and the back wall 54 which connects the side walls 50. The nodes 24 are formed on the side wall portions 52 and are rounded to slidably pass and guide a circuit card readily. The aperture 26 passes through the back wall 54 to separate the side walls 50 into two independently bendable beam members 50A and 50B.

With this construction, the side edge of a card 16 inserted into the slot 22 encounters the nodes 24 and spreads them apart through bending of the beam members 50A and 50B, which react with stiff resilience to provide a spring grip of the card 16. In a particular application of the invention, the fabricating material employed and the various dimensions used with determine the spring characteristics. Such card guides 20 allow the card 16 to be inserted into the connector 10 with nominal force and yet firmly support the card 16 once inserted so that vibration is effectively suppressed.

Figure 6:
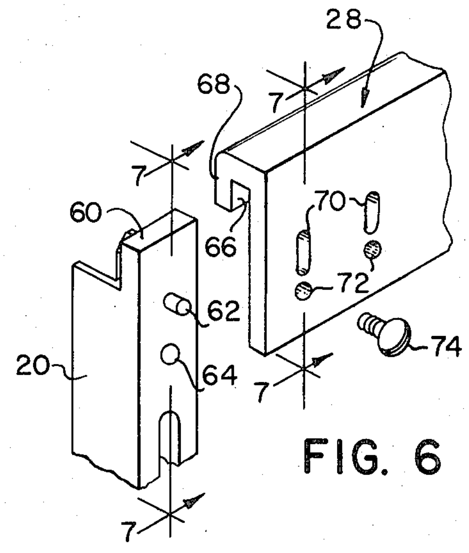
FIG. 6 is an isometric view of the free end of a long card guide and of a support bar constructed in accordance with the invention.
Figure 7:
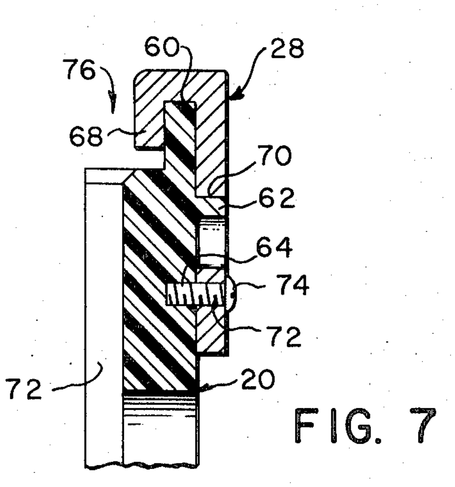
FIG. 7 is a sectional assembled view along the line 7—7 of FIG. 6.

FIGS. 6 and 7 show in more detail respectively the free end of a card guide 20, an end of the tie beam 28, and the manner in which the two fit together. The card guide 20 has an upstanding rectangular tab 60 forming its free end, an outwardly protruding peg 62 and a fastener-receiving hole 64. The tie beam 28 has a slot 66 for receiving the tab 60, a slot 70 for receiving the peg 62, and a hole 72 which is aligned with the hole 64 for receiving a fastening screw 74. The beam 28 can be of aluminum or plastic or other strong and light-weight material. The slot 66 is not deeper than the tab 60 is long, so that the beam 28 seats on top of the tab 60, and the wall 68 is sufficiently thin to leave a clearance space 76 for the slot 22. Within these limits, the dimensions can vary to suit specific needs. When several card guides 20 are attached to the tie beam 28, the resultant cage which this structure forms effectively suppresses vibration of the guides 20.

The invention thus provides both a cage or receptacle for printed circuit structures which is mounted entirely on the connectors for the printed circuits, and a vibration-suppressing card guide for use in such a receptacle whether mounted on the connector or otherwise. The receptacle structure can readily be made strong, lightweight, secure and easy to assemble and to modify. Also, the receptacle enables a dense packaging of circuit cards in it, and it maintains alignment and spacing of cooperating elements. Further, the receptacle not only is mounted directly on the connectors and hence assembled above the connector-mounting panel, but is provides complete bussing connections connections above the panel and accessible for facile installation and modification. U.S. patent application Ser. No. 159,732, filed concurrently with this application and commonly assigned, in the name of Lennart B. Johnson for BUSSING CONSTRUCTION FOR PRINTED CIRCUIT CONNECTORS concerns the bussing conductor structure.

The vibration-resistant card guides of the invention, which are readily interconnected by tie beams as disclosed for secure spacing and further vibration resistance, provide a one-piece, readily-fabricated guide construction which exerts a resilient clamping force on printed circuit cards, boards and like structures.

Having described the invention, what is claimed and secured by Letters Patent is:

1. In receptacle apparatus for plural printed circuit structures, each of which has electrical contacts adjacent one edge thereof and has two side edges transverse to said one edge, and having a connector recessed with an elongated socket channel for seatingly receiving one circuit structure with connector contacts engaged with said contacts of the circuit structure, and further having guides for slidably receiving said side edges of said circuit structures, the improvement wherein each said connector mounts interconnected guide and support means for said printed circuit structures, said improvement comprising A. a body on each said connector recessed to form said socket therein and extending beyond both longitudinal ends of said channel to form a pair of guide-mounting portions on said connector on an upper surface thereof, B. an elongated member upstandingly mounted directly on each end of each said connector, said mounting being exclusively at each said upper surface connector-provided mounting portion to form one said guide and having a longitudinal guide slot extending therealong from the end of said guide member removed from said connector toward said connector, said guide slot facing the guide slot of another guide mounted on the other mounting portion of that connector, and C. a pair of beam members interconnecting said guides at locations thereon spaced from said connectors, each beam member interconnecting one guide on each connector with other guides on corresponding ends of other connectors.

2. In receptacle apparatus as defined in claim 1, the further improvement wherein said beam members interconnect said guides along paths out-of-line from said guide slots.

3. In receptacle apparatus as defined in claim 1, the further improvement wherein said pair of mounting portions on each connector dispose said two guides mounted thereon with the guide slots thereof lying in a common plane which is parallel to the elongation of said channel of that connector.

4. In receptacle apparatus as defined in claim 1, the further improvement wherein said pair of mounting portions on each connector dispose said two guides mounted thereon with the guide slots thereof coplanar with the channel of that connector.

5. In receptacle apparatus as defined in claim 1, the further improvement wherein A. each said guide-forming elongated member has a tab extending longitudinally from said end thereof, B. each said beam member has a longitudinal slot therein mountingly-receiving said tabs of plural guide-forming elongated members, and C. further connecting means attaching each said beam member to one said guide-forming elongated member.

6. In receptacle apparatus for plural printed circuit structures, each of which has electrical contacts adjacent one edge thereof and has two side edges transverse to said one edge, and having a connector recessed with an elongated socket channel for seatingly receiving one circuit structure with connector contacts engaged with said contacts of the circuit structure and further having guides for slidably receiving said side edges of said circuit structures, the improvement comprising A. a body on each said connector recessed to form a socket therein and extending beyond both longitudinal ends of said channel to form a pair of guide-mounting portions on said connector.

B. an elongated member upstandingly-mounted on each said connector-provided mounting portion to form one said guide and having a longitudinal slot extending therealong from the end removed from said connector toward said connector, said guide slot facing the guide slot of another guide-forming elongated member mounted on the other mounting portion of that connector, C. a pair of beam members interconnecting said guides at locations thereon spaced from said connectors, each beam member interconnecting one guide on each connector with other guides on corresponding ends of other connectors, D. each said connector further comprising means for mountingly receiving a bus conductor extending transverse to both said channel therein and said guides, with said conductor mounting means being disposed beyond the longitudinal ends of said channel therein, E. at least one contact one each said connector in said socket channel thereof, and F. a bus conductor mounted in said conductor mounting means of plural adjacent connectors.

7. In receptacle apparatus as defined in claim 6, the further improvement wherein at least plural ones of said connector contacts have wire-wrap terminals extending from said connectors in a first direction opposite to the opening into said socket channel, and said connectors are free of conductors other than said wire-wrap terminals exposed from the sides thereof facing in said first direction.

8. In receptacle apparatus for plural printed circuit structures, each of which has electrical contacts adjacent one edge thereof and has two side edges transverse to said one edge, and having a connector recessed with an elongated socket channel for seatingly receiving one circuit structure with connector contacts engaged with said contacts of the circuit structure, and further having guides for slidably receiving said side edges of said circuit structures, the improvement comprising A. a body on each said connector recessed to form a socket therein and extending beyond both longitudinal ends of said channel to form a pair of guide-mounting portions on said connector, B. an elongated member upstandingly-mounted on each said connector-provided mounting portion to form one said guide and having a longitudinal slot extending therealong from the end removed from said connector toward said connector, said guide slot facing the guide slot of another guide-forming elongated member mounted on the other mounting portion of that connector, C. a pair of beam members interconnecting said guides at locations thereon spaced from said connectors, each beam member interconnecting one guide on each connector with other guides on corresponding ends of other connectors, D. slot means on each said connector beyond one longitudinal end of said channel therein for mountingly receiving a bus conductor extending transverse to both said channel therein and said guides thereon, and E. a bus conductor mounted in said slot means of plural connectors.

* * * * *